United States Patent
Cohen

(10) Patent No.: US 8,930,796 B2
(45) Date of Patent: Jan. 6, 2015

(54) ERROR PROTECTION TRANSCODERS

(71) Applicant: Aaron E. Cohen, Alexandria, VA (US)

(72) Inventor: Aaron E. Cohen, Alexandria, VA (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 140 days.

(21) Appl. No.: 13/680,196

(22) Filed: Nov. 19, 2012

(65) Prior Publication Data
US 2014/0143638 A1     May 22, 2014

(51) Int. Cl.
*H03M 13/00* (2006.01)
*H03M 13/11* (2006.01)

(52) U.S. Cl.
CPC ........ *H03M 13/1102* (2013.01); *H03M 13/116* (2013.01); *H03M 13/611* (2013.01); *H03M 13/618* (2013.01); *H03M 13/6362* (2013.01); *H03M 13/6561* (2013.01)
USPC ....................................................... 714/776

(58) Field of Classification Search
CPC .............................. H03M 13/00; H03M 13/13
USPC ......................................... 714/776; 375/240
See application file for complete search history.

(56) References Cited

U.S. PATENT DOCUMENTS

2005/0053130 A1* 3/2005 Jabri et al. ..................... 375/240
2013/0346823 A1* 12/2013 Cideciyan ..................... 714/752

OTHER PUBLICATIONS

Fewer, Colm P. et al., A Versatile Variable Rate LDPC Codec Architecture, IEEE Transactions on Circuits and Systems—I: Regular Papers, vol. 54, No. 10, Oct. 2007.
Kim, Namshik et al., A Variable Rate LDPC Coded V-BLAST System using the MMSE QR-Decomposition, in proceeding of: Vehicular TEchnology Conference, 2004, VTC2004-Fall.
Honda, Junya et al., Variable Length Lossy Coding using an LDPC Code, ISIT 2009, South Korea, Jun. 28-Jul. 3, 2009.
Baldi, Marco et al., Variable Rate LDPC Codes for Wireless Applications, Proc. International Conference on Software, Telecommunications and Computer Networks (SoftCom 2006).
Paper S9-6017-2909, Split—Dubrovnik, Croatia, Sep. 29-Oct. 1, 2006, ISBN:953-6114-87-9.

* cited by examiner

*Primary Examiner* — Sam Rizk
(74) *Attorney, Agent, or Firm* — US Naval Research Laboratory; Suresh Koshy

(57) ABSTRACT

A variable data rate error protection transcoder includes an input mapper receiving an input transcodeable codeword and outputting an input intermediate codeword. The input transcodeable codeword includes at least one input transcodeable information bit and at least one input transcodeable parity bit. The variable data rate error protection transcoder also includes an intermediate codeword transcoder receiving the input intermediate codeword and outputting an output intermediate codeword. The variable data rate error protection codeword also includes an output mapper receiving the output intermediate codeword and outputting an output transcoded codeword. The output transcoded codeword includes at least one output transcoded information bit and at least one output transcoded parity bit.

29 Claims, 6 Drawing Sheets

FIG. 1 – PRIOR ART

ERROR PROTECTION TRANSCODERS

FIELD OF THE INVENTION

The present invention relates generally to assurance of quality of service in digital communications, and more specifically to reliable variable data rate transmission.

BACKGROUND OF THE INVENTION

Modern network systems suffer from network congestion during periods of high use. When network congestion overwhelms the network, the network suffers from congestion collapse. In this state, the network is unusable for real-time data traffic. Modern networks have many methods thr controlling the flow of data across networks to alleviate network congestion. The Transmission Control Protocol ("TCP") limits the amount of information that has been sent, but not acknowledged, during any period of time. This information falls under the congestion window. When the round trip time decreases. TCP can increase the amount of information in the congestion window. The mechanisms for this are defined by the Internet Engineering Task Force ("IETF"). User Datagram Protocol ("UDP") and other protocols that are used for real-time streaming applications have other methods for handling network congestion based on round trip time.

Although network congestion is a primary contributor to decreased quality of service for streaming media, unreliable communication mediums are another factor impeding quality of service over real world networks. Fortunately, using error correction code technology is one such solution that can increase reliability by sacrificing bandwidth.

Error correcting codes ensure reliable communication through noisy channels by adding redundancy to digital information prior to transmission. In essence they are a protection mechanism. Error correcting codes can be classified as either block codes or tree codes depending on whether they do not require memory (i.e., block codes) or if they do (i.e. tree codes). While there are several block codes in use today such as Bose-Chaudhuri-Hocquenghem (BCH) codes, Reed-Solomon codes, and Low Density Parity Check (LDPC) codes, LDPC codes achieve the lowest bit error rates using soft-decision decoding. In the prior art, as shown in FIG. 1, an input codeword 10 of a data stream to be transmitted is inputted into a block encoder 20, the output of which is transmitted through a network 30. An example of network 30 is a wide area network, such as the Internet. That output is inputted into a block decoder 40, which generates an output codeword 50.

The primary challenges with implementing LDPC codes are finding an LDPC code that has a low error floor. LDPC codes that contain short cycles in their trellis representation do not achieve low error floors. Ideally, the interconnectedness is what allows LDPC codes to achieve higher reliability for individual bits because the LPDC codes can base the reliability of the individual bit on multiple other bits that are directly connected to it. Bits that are further away do have an impact, which is taken into account through the iterative decoding process.

Disadvantages with using LDPC codes include the following. First, LDPC codes require fixed length input sources. Second, they require re-encoding, if the information bits change.

SUMMARY OF THE INVENTION

This summary is intended to introduce, in simplified form, a selection of concepts that are further described in the Detailed Description. This summary is not intended to identify key or essential features of the claimed subject matter, nor is it intended to be used as an aid in determining the scope of the claimed subject matter. Instead, it is merely presented as a brief overview of the subject matter described and claimed herein.

An embodiment of the invention includes a variable data rate error protection transcoder. The transcoder includes an input mapper receiving an input transcodeable codeword and outputting an input intermediate codeword. The input transcodeable codeword includes at least one input transcodeable information bit and at least one input transcodeable parity bit. The variable data rate error protection transcoder also includes an intermediate codeword transcoder receiving the input intermediate codeword and outputting an output intermediate codeword. The variable data rate error protection codeword also includes an output mapper receiving the output intermediate codeword and outputting an output transcoded codeword. The output transcoded codeword includes at least one output transcoded information bit and at least one output transcoded parity bit.

A method of variable data rate error protection transcoding includes mapping an input transcodeable codeword to an input intermediate codeword, as shown in FIG. 3. The input codeword includes at least one input transcodeable information bit and at least one transcodeable input parity bit. The input intermediate codeword is transcoded into an output intermediate codeword, as shown in FIG. 3. The output intermediate codeword is mapped to an output transcoded codeword, as shown in FIG. 3. The output transcoded codeword includes at least one output transcoded information bit and at least one output transcoded parity bit.

BRIEF DESCRIPTION OF THE DRAWINGS

The present invention is described with reference to the accompanying figures. In the figures, like reference numbers indicate identical or functionally similar elements. Additionally, the left-most digit or digits of a reference number identify the figure in which the reference number first appears. The accompanying figures, which are incorporated herein and form part of the specification, illustrate the present invention and, together with the description, further serve to explain the principles of the invention and to enable a person skilled in the relevant art to make and use the invention.

DETAILED DESCRIPTION OF THE INVENTION

Applicant determined that a challenge to implementing error correction code transcoders is to develop efficient methods for transcoding from one codeword to another without performing a full error correction code encoding or without addressing round trip time.

Figure 1:
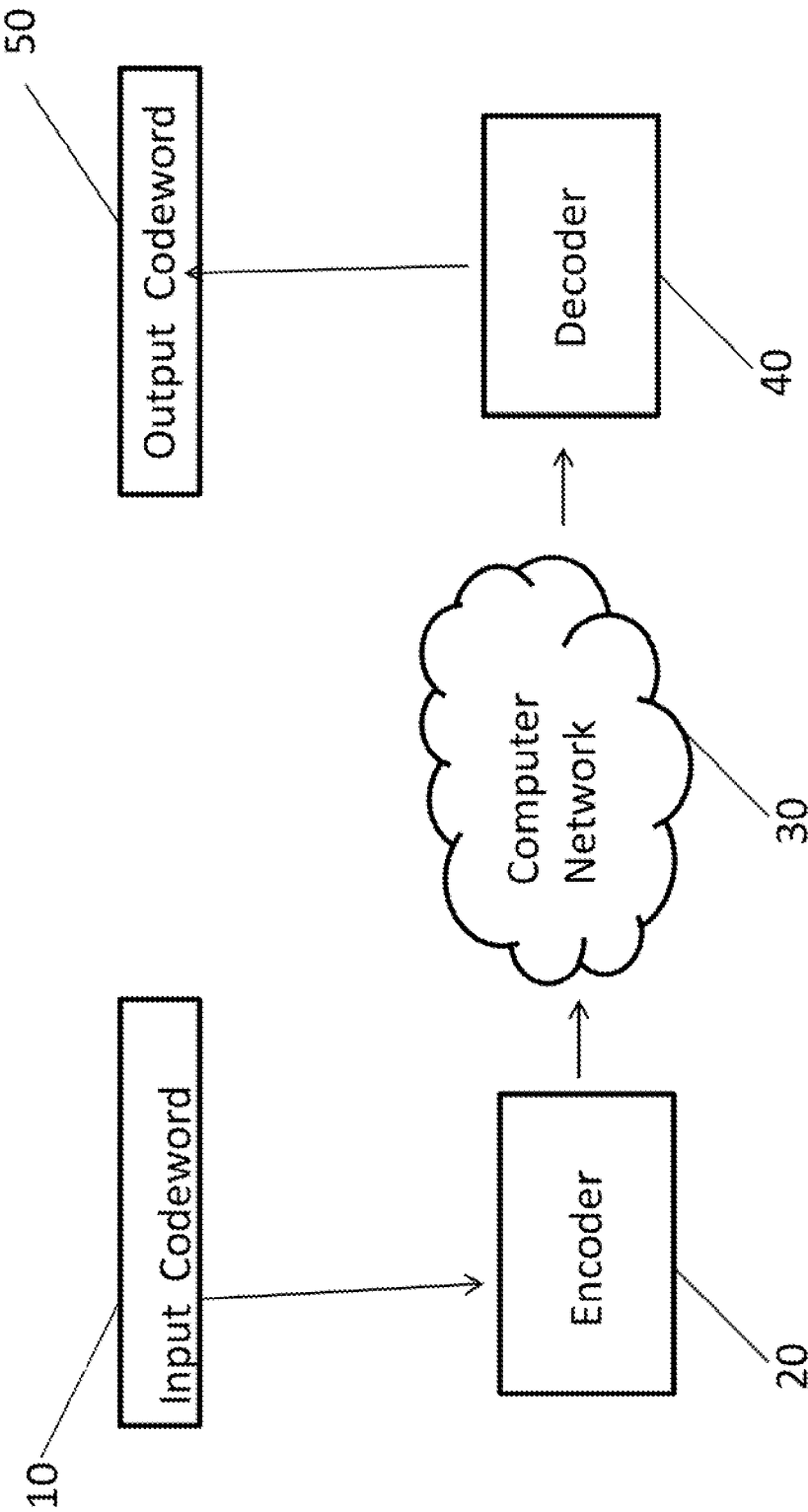
FIG. 1 is a block diagram of a prior art transcoding system.
Figure 2:
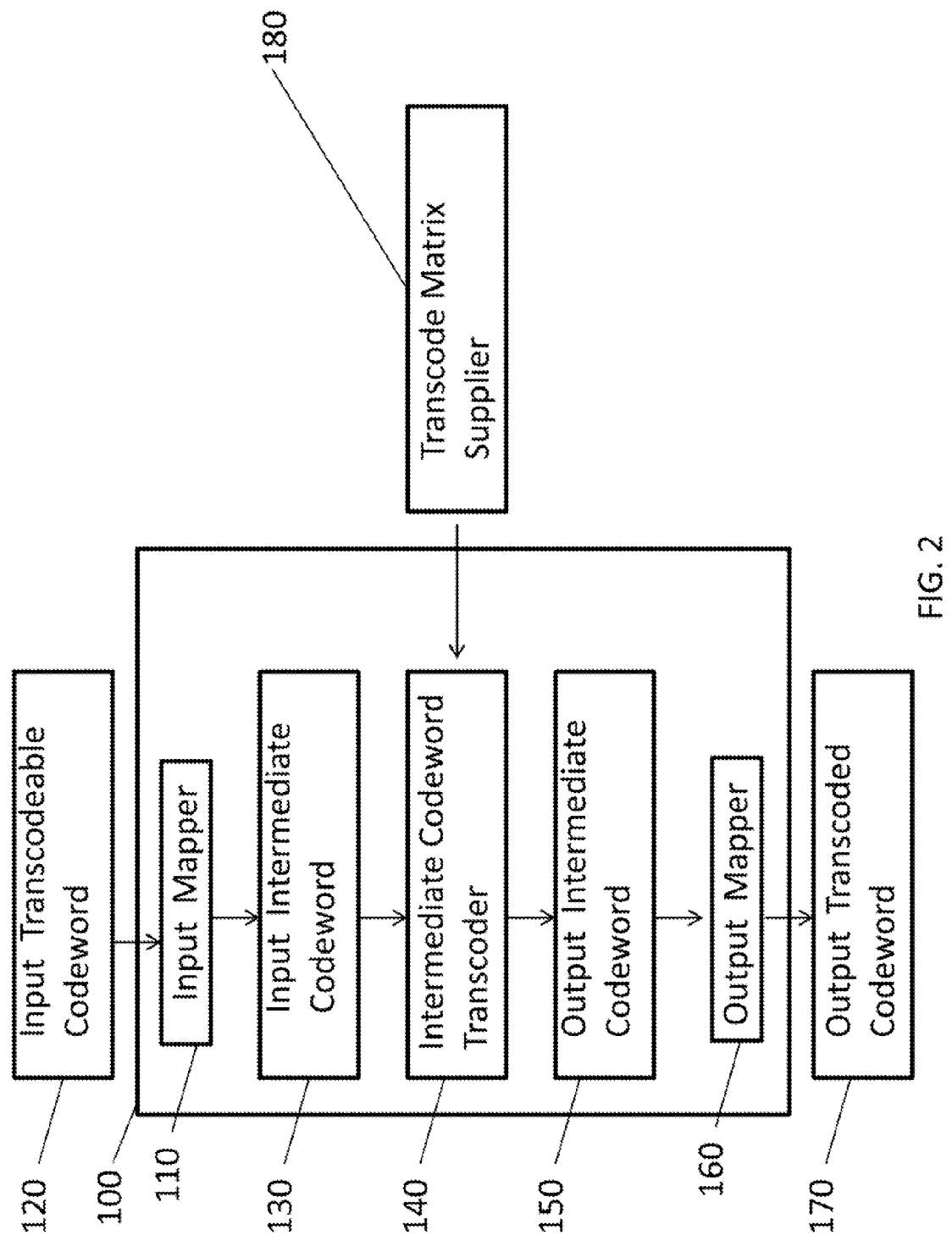
FIG. 2 is a block diagram of an embodiment of the instant invention.

As shown in by way of non-limiting illustration in FIG. 2, an embodiment of the invention includes a variable data rate error protection transcoder 100. The transcoder 100 includes an input mapper 110 receiving an input transcodeable codeword 120 and outputting an input intermediate codeword 130. The input transcodeable codeword 120 includes at least one input transcodeable information bit and at least one input transcodeable parity bit. The variable data rate error protection transcoder 100 also includes an intermediate codeword transcoder 140 receiving the input intermediate codeword 130 and outputting an output intermediate codeword 150. The variable data rate error protection codeword 130 also includes an output mapper 160 receiving the output intermediate codeword 150 and outputting an output transcoded codeword 170. The output transcoded codeword 170 includes at least one output transcoded information bit and at least one output transcoded parity bit.

Optionally, the input mapper 110 reduces, expands, adapts, or passes-through the input transcodeable codeword 120 to generate the input intermediate codeword 130. For the purpose of this specification and the attached claims, expanding means expanding the number of parity bits while keeping the same number of information bits; commonly, expanding is done when adding an overall parity check.

Optionally, the output mapper 160 reduces, expands, adapts, or passes-through the output intermediate codeword 150 to generate the output transcoded codeword 170.

Optionally, the variable data rate error protection transcoder 100 also includes a transcode matrix supplier 180 inputting a transcode matrix to said intermediate codeword transcoder 140. The transcode matrix can be computed from the generator matrices of two separate block codes, for example, as follows. First, the information bit orientation from the old code is permutated to the new code. This allows the parity values to correspond to the same information bits. Next, all parity values that occur in both codes are found and eliminated from the list in the new code because they are a one-to-one mapping. The remaining parity values in the new code are computed based on the original information values and the original parity values. A standard technique, such as substructure sharing, is utilized to minimize the number of additions (i.e., locations of 1 in the transcode matrix). After the final parity value equations are known, the transcode matrix that maps the input codeword to the output codeword is formed. Optionally, the intermediate codeword transcoder 140 matrix-multiplies the transcode matrix and the input intermediate codeword 130 to generate the output intermediate codeword 150. Optionally, the intermediate codeword transcoder 140 comprises standard XOR logic. Alternatively, the intermediate codeword transcoder 140 comprises a plurality of standard functional units. Optionally, the plurality of standard functional units include a plurality of standard adders or a plurality of standard modulo operators. Optionally, the plurality of standard modulo operators includes a plurality of standard Montgomery multipliers. Optionally, the intermediate codeword transcoder 140 includes parallel circuitry, sequential circuitry, or digit-serial circuitry.

Figure 3:
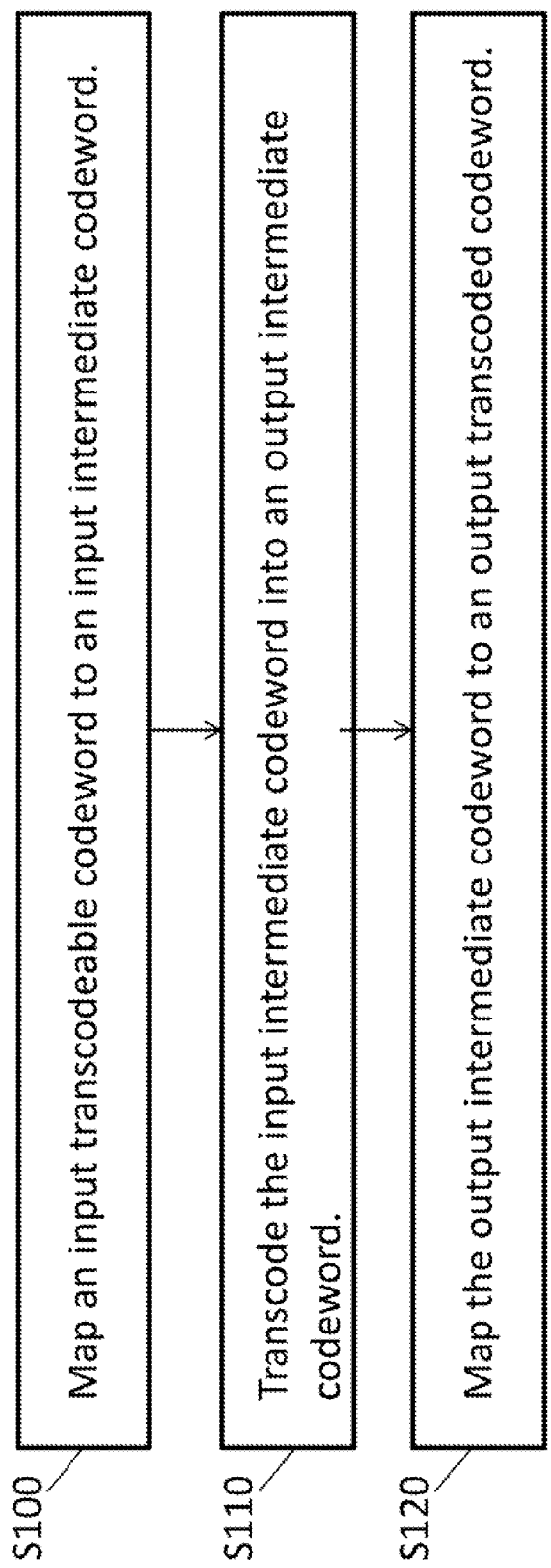
FIG. 3 is a flowchart of an embodiment of the instant invention.

An embodiment of the operation of the invention is described as follows by way of non-limiting reference to FIG. 3. A method of variable data rate error protection transcoding includes mapping an input transcodeable codeword to an input intermediate codeword, as shown in STEP S100. The input codeword includes at least one input transcodeable information bit and at least one transcodeable input parity bit. The input intermediate codeword is transcoded into an output intermediate codeword, as shown in STEP S110. The output intermediate codeword is mapped to an output transcoded codeword, as shown in STEP S120. The output transcoded codeword includes at least one output transcoded information bit and at least one output transcoded parity bit.

Optionally, mapping an input transcodeable codeword to an input intermediate codeword includes reducing, expanding, adapting, or passing-through the input transcodeable codeword to generate the input intermediate codeword. Optionally, reducing the input transcodeable codeword to generate the input intermediate codeword includes puncturing the input transcodeable codeword, and/or shortening the input transcodeable codeword. For the purpose of this specification and the attached claims, puncturing, from coding theory, is the process of removing some (though not all) of the parity values from a codeword after encoding with an error-correction code; shortening, from coding theory, is the process of setting some (though not all) of the information values to zero before encoding with an error-correction code and removing those information values from a codeword after encoding with an error-correction code. Optionally, expanding the input transcodeable codeword to generate the input intermediate codeword includes extending the input transcodeable codeword, direct summing the input transcodeable codeword, and/or punctured direct summing the input transcodeable codeword. For the purpose of this specification and the attached claims, direct summing means expanding the number of information bits and parity bits; commonly, direct summing is done by combining two independent codewords. For the purpose of this specification and the attached claims, punctured direct summing means expanding the number of information bits while keeping the same number of parity bits. In coding theory and for the purpose of this specification and the attached claims, the direct sum is the sum of two codewords $(n1,k1,d1)$ and $(n2,k2,d2)$ such that the output codeword is an $(n, k, d)$ code where $n=n1+n2$, $k=k1+k2$, and $d=\min\{d1,d2\}$. In coding theory and for the purpose of this specification and the attached claims, the punctured direct sum is defined as puncturing the output codeword generated by the direct sum. Optionally, adapting the input transcodeable codeword to generate the input intermediate codeword includes permutating at least one parity bit of the input transcodeable codeword, permutating at least one information bit of the input transcodeable codeword, and/or permutating at least one input transcodeable parity bit and at least one input transcodeable information bit of the input transcodeable codeword. For the purpose of this specification and the attached claims, permutating is the process of generating a permutation from one ordering to a new ordering. When this is applied to codewords, the information values can be permutated, the parity values can be permutated, or both values can be permutated to generate a new codeword.

Optionally, mapping the output intermediate codeword to an output transcoded codeword includes reducing, expanding, adapting, or passing-through the output intermediate codeword to generate the output transcoded codeword. Optionally, reducing the output intermediate codeword to generate the output transcoded codeword includes puncturing the output intermediate codeword and/or shortening the output intermediate codeword. Optionally, expanding the output intermediate codeword to generate the output transcoded codeword includes extending the output intermediate codeword, direct summing the output intermediate codeword, and/or punctured direct summing the output intermediate codeword. Optionally, the output intermediate codeword includes at least one output intermediate information bit and at least one output intermediate parity bit; adapting the output intermediate codeword to generate the output transcoded codeword includes permutating the at least one output intermediate parity bit of the output intermediate codeword, permutating the at least one output intermediate information bit of the output intermediate codeword, and/or permutating the at least one output intermediate parity bit and the at least one output intermediate information bit of the output intermediate codeword.

Optionally, transcoding the input intermediate codeword into an output intermediate codeword includes matrix-multiplying a transcode matrix and the input intermediate codeword to generate the output intermediate codeword.

In error correction code terminology, a codeword (c) is specified as $c=s*G=[s\ p]$ or by $Hc^T=0$, where information values are represented by s, parity (p) values, the G matrix and H matrix have a special relationship which defines the error correction code. The G matrix can be written in the form $G=[I_k\ P]$ where $I_k$ is the identity matrix of size k*k, where k is the number of information values, and P is the parity matrix which defines the relationship between the information values and parity values. The H matrix can be written in the form $H=[-P^T\ I_{n-k}]$, where k is the identity matrix of size (n-k)*(n-k), where k is the number of information values, n is the number of codeword values, and P is the parity matrix which defines the relationship between the information values and parity values.

Error correction code transcoding is the process by which a codeword ($c_1$) of length ($n_1$) presented for an error correction code defined by matrix $H_1$ is transcoded into a codeword ($c_2$) of length ($n_2$) that can be decoded by a final error correction code defined by matrix $H_2$. For error free transmission the following constraint $H_1 c_1^T=0$ must hold on $c_1$ prior to transmission. For error free transmission the following constraint $H_2 c_2^T=0$ must hold on $c_2$ prior to transmission. The transcoder operates in three different modes. When $n_2<n_1$, the transcoder is shrinking the transmitted data. When $n_2>n_1$, the transcoder is expanding the transmitted data. When $n_2=n_1$, the transcoder is adapting the transmitted data.

The following is a discussion of another embodiment of the instant invention, namely, the error protection transcoder 100 operating in shrinking mode.

Input mapper 110 and/or output mapper 160, for example, includes a mapper for shrinking information value bits. For instance, the mapper for shrinking information bits includes a standard switch matrix, a standard netlist, or a collection of standard exclusive-OR logic gates connecting input to output. Input mapper 110 and/or output mapper 160, for example, includes a mapper for shrinking the parity value bits. For instance, the mapper for shrinking parity bits includes a standard switch matrix, a collection of standard nets, or a collection of standard exclusive-OR logic gates connecting input to output.

Input mapper 110 and/or output mapper 160 operating in shrinking mode connect or compute the new information values and the new parity values. Such mappers are, for example, implemented in a parallel design such that all new information values and all new parity values are available at the same time. In a parallel design, the mapper for shrinking information value bits and the mapper for shrinking parity value bits take the input from the initial information values and parity values. Through connections and/or computation, the mapper for shrinking information bits generates as output new information values, and the mapper for shrinking parity bits generates new parity values. For the mapper for shrinking information bits, the total number of output information value bits is less than the total number of input information value bits. For the mapper for shrinking parity bits, the total number of output parity value bits is less than the total number of input parity value bits.

In more detail, illustrative steps for error protection transcoder in shrinking mode include the following.

1. Shrink Information Values.

This step consists of removing and/or mapping and/or altering and/or compressing information values.

Given a codeword defined as $c_1=s_1*G=[s_1\ p_1]$ where $c_1$ is a codeword for a code specified by the G matrix, $s_1$ are the information values, and $p_1$ are the parity values. And given a codeword defined as $c_2=s_2*G=[s_2\ p_2]$ where $c_2$ is a codeword for a code specified by the G matrix, $s_2$ are the information values, and $p_2$ are the parity values. Then one can define $c_3=c_1$ xor $c_2$, where $c_3$ is a valid codeword. If $c_1$ is the original codeword with $s_1$ information values, and $s_2$ are the information values that are going to be removed then $s_3$ is the desired outcome when removing the $s_2$ values and $p_3$ are the parity values corresponding to the original code. Further work is required as shown in step 2 to generate the desired parity values for the final code.

2. Map to Punctured Code or Alternative Code

This step consists of removing and/or mapping and/or altering and/or compressing parity values.

As an example for a punctured code, given a G matrix where $G=[I_k\ P_{k*(n-k)}]$ representing the original code and G' matrix where $G'=[I_k\ P_{k*(n-k-p)}]$. Then puncturing the code defined by the G matrix is equivalent to dropping (p) columns from the P submatrix in the G matrix.

3. Reduce Codeword Length

This step consists of removing and/or compressing the size of the codeword. Essentially, this step combines the results from steps 1 and 2 to generate a codeword with shorter length than the original codeword. The new codeword is not required to satisfy the constraints of the original code but instead must satisfy the constraints of the new code.

The following is a discussion of another embodiment of the instant invention, namely, the error protection transcoder operating in expanding mode.

Input mapper 110 and/or output mapper 160 include a mapper for expanding information value bits. The mapper for expanding information value bits includes, for example, a standard switch matrix, a collection of standard nets, or a collection of standard exclusive-OR logic gates connecting input to output. Input mapper 110 and/or output mapper 160 also include a mapper for expanding parity value bits. The mapper for expanding parity value bits includes, for example, is a standard switch matrix, a collection of standard nets, or a collection of standard exclusive-OR logic gates connecting input to output.

Input mapper 110 and/or output mapper 160 operating in expanding mode connect or compute new information values and new parity values. Such mappers can be implemented in a parallel design such that all new information values and all new parity values are available at the same time. In a parallel design, the mapper for expanding information value bits and the mapper for expanding parity value bits take the input from the initial information values and parity values. Through connections and/or computation, the mapper for expanding information value bits generates as output new information values and the mapper for expanding parity value bits generates as output new parity values. For the mapper for expanding information value bits, the total number of output information values is greater than the total number of input information values. For the mapper for expanding parity value bits, the total number of output parity values is greater than the total number of input parity values.

In more detail, illustrative steps for error protection transcoder in expanding mode include the following:

1. Map to Alternative Code and/or Reverse the Puncturing Process

This step consists of adding and/or mapping and/or altering and/or compressing parity values.

As an example for a punctured code, given a G matrix where $G=[I_k\ P_{k*(n-k)}]$ representing the new code and G' matrix where $G'=[I_k\ P_{k*(n-k-p)}]$ is the original code. Then reversing the puncturing process leads to the code defined by the G matrix. This is equivalent to adding (p) columns to the P submatrix.

2. Expand Information Values.

This step consists of adding and/or mapping and/or altering and/or decompressing information values.

Given a codeword defined as $c_1=s_1*G=[s_1\ p_1]$ where $c_1$ is a codeword for a code specified by the G matrix, $s_1$ are the information values, and $p_1$ are the parity values. And given a codeword defined as $c_2=s_2*G=[s_2\ p_2]$ where $c_2$ is a codeword for a code specified by the G matrix, $s_2$ are the information values, and $p_2$ are the parity values. Then one can define $c_3=c_1$ xor $c_2$, where $c_3$ is a valid codeword. If $c_1$ is the original codeword with $s_1$ information values, and $s_2$ are the information values that are going to be added then $s_3$ is the desired outcome when adding the $s_2$ values and $p_3$ are the parity values corresponding to the new code.

3. Increase Codeword Length

This step consists of adding and/or decompressing the size of the codeword. Essentially, this step combines the results from steps 1 and 2 to generate a codeword with longer length than the original codeword. The new codeword is not required to satisfy the constraints of the original code but instead must satisfy the constraints of the new code.

The following is a discussion of another embodiment of the instant invention, namely, the error protection transcoder operating in adapting mode.

Input mapper 110 and/or output mapper 160, for example, include a mapper for adapting information value bits. The mapper for adapting information value bits, for example, includes a standard switch matrix, a collection of standard nets, or a collection of standard exclusive-OR logic gates connecting input to output. Input mapper 110 and/or output mapper 160, for example, includes a mapper for adapting the parity value bits. The mapper for adapting parity value bits, for example, includes a standard switch matrix, a collection of standard nets, a collection of standard exclusive-OR logic gates connecting input to output.

Input mapper 110 and/or output mapper 160 operating in adapting mode connect or compute new information values and new parity values. Such mappers can be implemented in a parallel design such that all new information values and all new parity values are available at the same time. In a parallel design, the mapper for adapting information value bits and the mapper for adapting parity value bits take the input from the initial information values and parity values. Through connections and/or computation, the mapper for adapting information value bits generates as output new information values, and the mapper for adapting parity value bits generates as output new parity values. For the mapper for adapting information value bits, the total number of output information values is equal to the total number of input information values. For mapper for adapting parity value bits, the total number of output parity values is equal to the total number of input parity values.

In more detail, illustrative steps for error protection transcoder in adapting mode include the following:

1. Adapt Information Values.

This step consists of changing and/or mapping and/or altering information values.

Given a codeword defined as $c_1=s_1*G=[s_1\ p_1]$ where $c_1$ is a codeword for a code specified by the G matrix, $s_1$ are the information values, and $p_1$ are the parity values. And given a codeword defined as $c_2=s_2*G=[s_2\ p_2]$ where $c_2$ is a codeword for a code specified by the G matrix, $s_2$ are the information values, and $p_2$ are the parity values. Then one can define $c_3=f(c_1,\ldots)$, where f is a function and $c_3$ is a valid codeword of a new code defined by G' matrix. If the function $f(\ldots)$ is an exclusive-OR operation such that $c_3=c_1$ xor $c_2$. Then the adapting code generates $s_3=s_1$ xor $s_2$, with $s_1$, $s_2$, and $s_3$ all of the same length.

2. Map to Alternative Code

This step consists of changing and/or mapping and/or altering the parity values.

As an example for a new code, given a G matrix where $G=[I_k\ P_{k*(n-k)}]$ representing the original code and G' matrix where $G'=[I_k\ P'_{k*(n-k)}]$ representing the new code. Then the new parity values are computed by multiplication with the P' sub matrix.

3. Final Codeword

This step combines the results from steps 1 and 2 to generate a codeword with equal length with the original codeword. The new codeword is not required to satisfy the constraints of the original code but instead must satisfy the constraints of the new code.

To further illustrate the previously described concepts for the error protection transcoder technology, exemplary implementations are described as follows.

Figure 4:
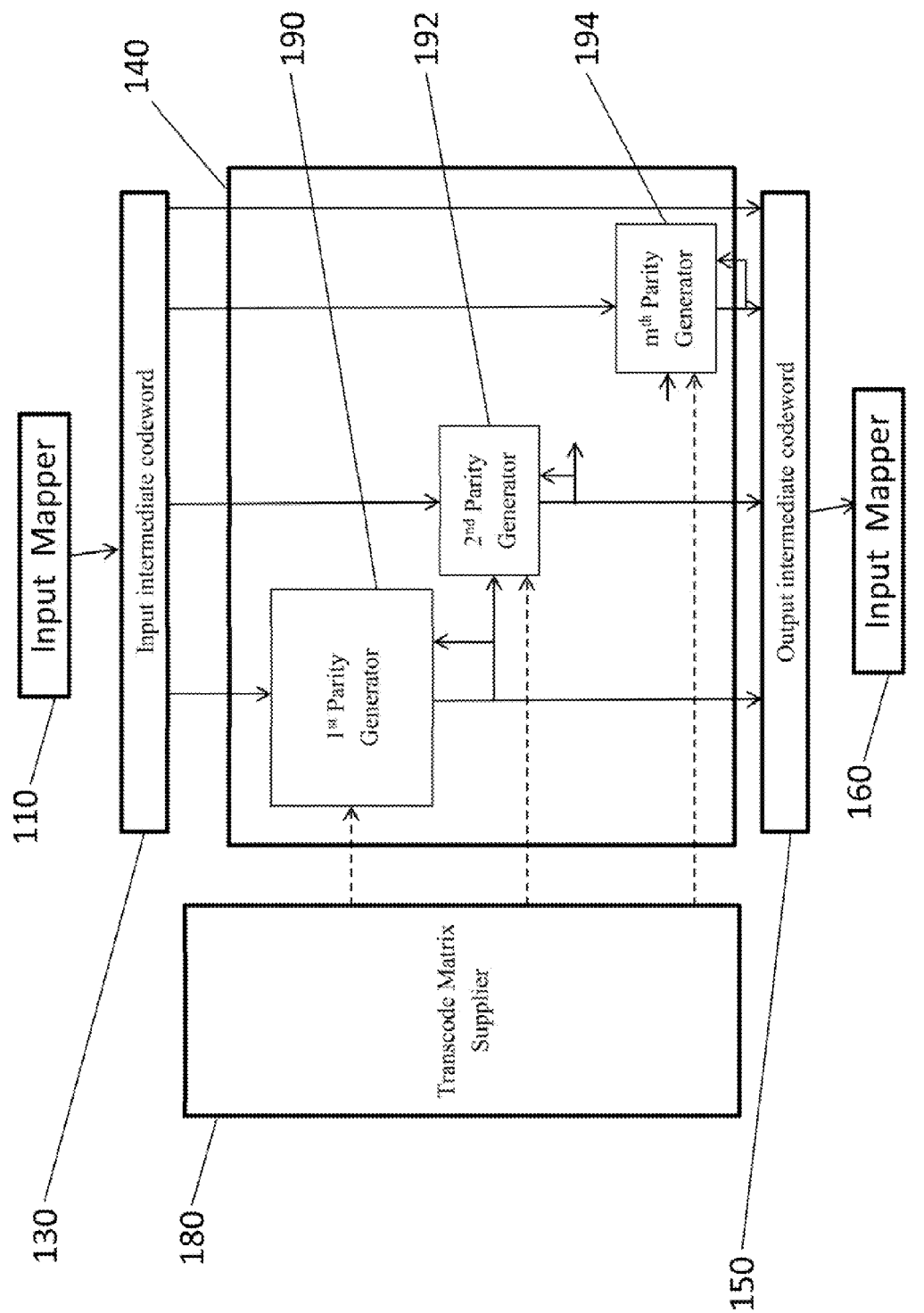
FIG. 4 is a block diagram of an alternative embodiment of the instant invention.

FIG. 4 shows by way of example an illustrative embodiment of the intermediate codeword transcoder 140 in the error protection transcoder 100. The configuration of the input and output mappers 110, 160 determines whether the overall design is operating in shrinking, adapting, or expanding mode.

First parity generator 190, for example, is a standard matrix multiplication unit or a tree consisting of one or more standard exclusive-OR logic gates. Second parity generator 192, for example, is a matrix multiplication unit or a tree consisting of one or more standard exclusive-OR logic gates. M-th parity generator block 194, for example, is a matrix multiplication unit or a tree consisting of one or more standard exclusive-OR logic gates.

As shown by way of illustration in FIG. 4, the error protection transcoder 100 and the transcode matrix supplier 180 provide a method for connecting or computing the new information values and the new parity values from the given information values, parity values, and transcode matrix supplier values. Input mapper 110 connects the input transcodeable codeword 130 to the input intermediate codeword 130. Intermediate codeword transcoder 140 takes the input intermediate codeword 130 and converts it to the output intermediate codeword 150 using a matrix multiplication operation. Intermediate codeword transcoder 140, for example, includes parity generators 190, 192, 194. These parity generators 190, 192, 194 form the basis for the transcode operation. The $1^{st}$ parity generator 190 performs the partial matrix multiplication which computes the first parity values from the input intermediate codeword. The $2^{nd}$ parity generator 192 performs the partial matrix multiplication which computes the second parity values from the input intermediate codeword. The $m^{th}$ parity generator 194 performs the partial matrix multiplication which computes the $m^{th}$ parity values from the input intermediate codeword. Transcode matrix supplier 180 supplies the coefficients used in the matrix multiplications for the parity generators 190, 192, 194. Additionally, intermediate codeword transcoder 140 computes the information values using matrix multiplication from the input intermediate codeword.

Figure 5:
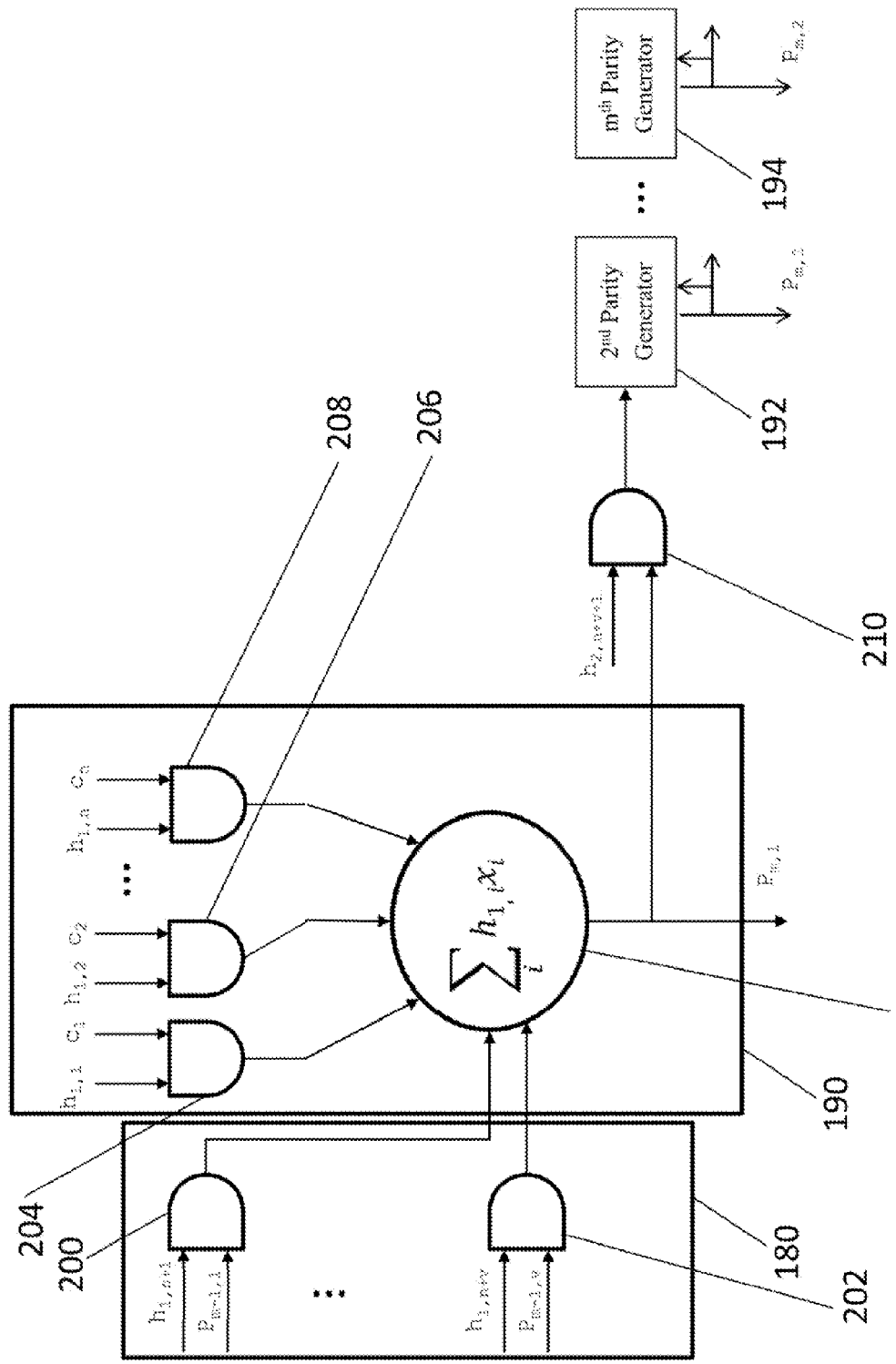
FIG. 5 is a schematic diagram of an illustrative transcode matrix supplier and an illustrative first parity generator operating in parallel mode according to the instant invention.

FIG. 5 shows an illustrative embodiment of a transcode matrix supplier 180 and a parity generator 190 according to the instant invention operating in parallel mode. The other ($2^{nd}$-m-th) parity generators 190, 194 are shown in block form to simplify the figure.

In FIG. 5, logical AND operators 200, 202, 204, 206, 208, 210 include, for example, a standard logical AND gate, a standard multiplexor, or a standard hardwired connection or open circuit depending on the value of $h_{ij}$. Standard summer 300, for example, includes a standard field summation unit, a tree of standard exclusive-OR gates or a tree of standard arithmetic logic unit (ALU) devices $1^{st}$ parity generator 190, for example, operates in parallel by converting the input intermediate codeword 130, ($c_i$) for i from 1 to n, into parity values. The logical AND operators perform masking with the transcode supplier matrix values. Summer 300 performs the field addition of the masked values for the first parity element in the first parity set of values. $2^{nd}$ parity generator 192 performs the field addition of the masked values along with the masked value of the first parity element to generate the second parity element in the first purity set of values. Parity generators not shown up to the m-th parity generator 194 perform the next parity element computations based on the input intermediate codeword and the computed parity elements.

Figure 6:
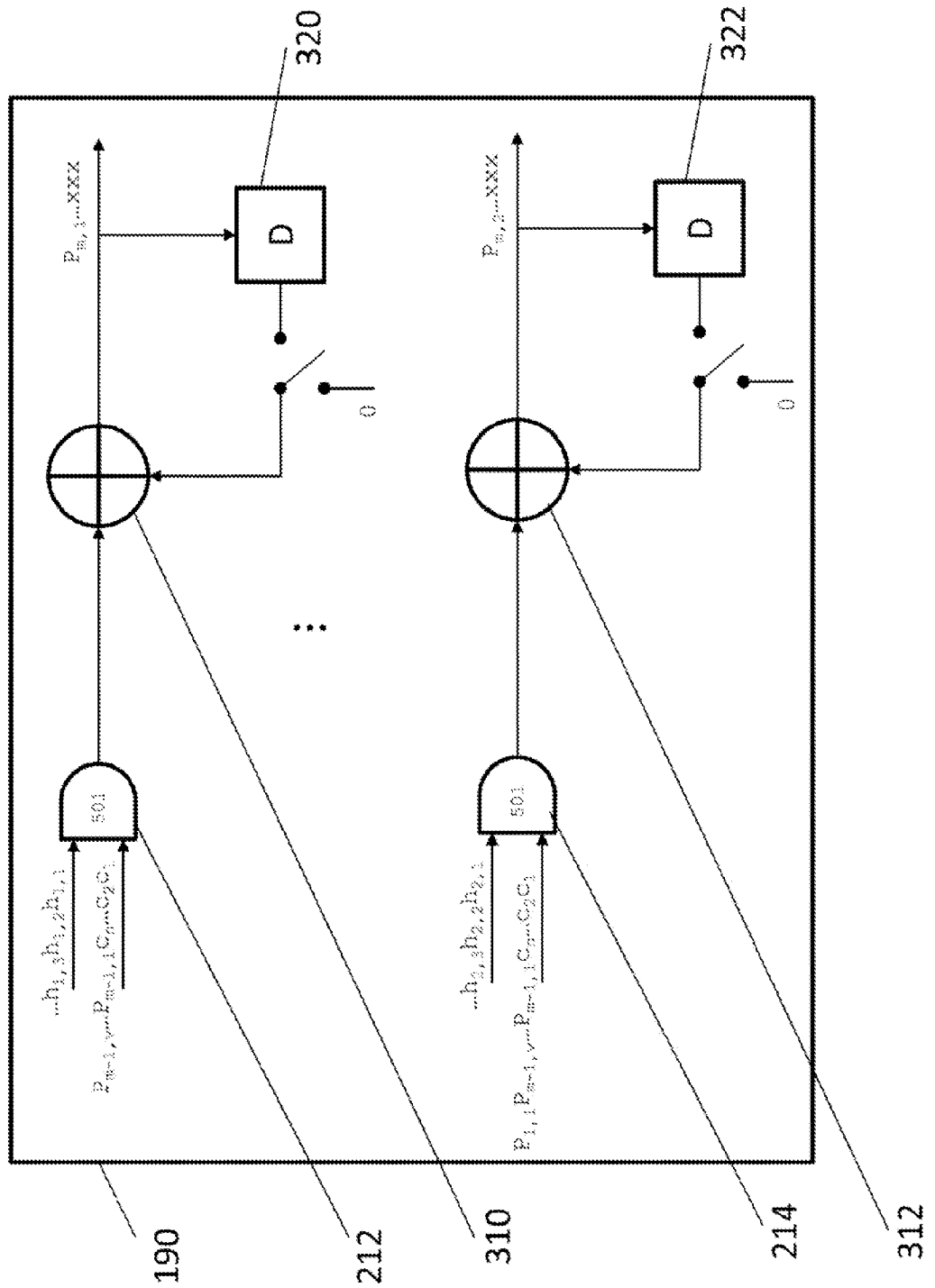
FIG. 6 is a schematic diagram of an illustrative first parity generator operating in bit-serial mode according to the instant invention.

FIG. 6 shows an illustrative embodiment of a parity generator 190 according to the instant invention operating in a bit-serial mode.

As shown in FIG. 6, The first parity generator 190, for example, includes standard logical AND operators 212, 214, standard summers 310, 312, and standard delay elements 320, 322. For example, summers 310, 312 include a standard field addition unit, or a standard arithmetic logic unit (ALU). Standard delay elements 320, 322, for example, include a parallel array of one or more standard flip-flops. Collectively, these components form the first parity generator 190 for the first set of parity values. Similarly, second through m-th parity generators 192,194 are fashioned.

Parity generator 190 operating in bit-serial mode operates, for example, as follows. The input intermediate codeword 130 and the transcode matrix supplier 180 values are masked together with a logical AND operator such as discussed in the parallel mode operation above, but are performed in a sequential manner instead. The output of the logical AND operator 212 is fed as input to summer 310. Summer 310 performs the field addition of the output of delay element 320 and the input from the logical AND operator 212. The output of the summer 310 is fed to the input of the delay element 320. The delay element 320 delays the output of the summer 310 by 1 cycle and feeds this delayed output to summer 310 as input. The output of the summer 310 from the first parity generator 190 will be the first parity element from the first parity set of values after n cycles. The second through m-th parity generators 192,194 operate similarly. For example, the output from a similarly fashioned second parity generator will be the second parity element from the first parity set of values after n+1 cycles.

The above descriptions present the concept of error protection transcoding along with illustrative implementations of error protection transcoders. An example implementation using quasi-cyclic low density parity check (LDPC) codes is presented. One or more embodiments of the invention employing the described architecture achieves lower complexity than a traditional encoder and will achieve lower power consumption. The actual bit-error rate (BER) performance will be dictated by the performance of the shorter code when the codes share columns between the different H matrices. For the 802.11 LDPC code using R=1/2 and z=27, simulations have shown that with a stddev=0.6 for the noise level on a BPSK+AWGN channel transcoding from a codeword of length 648 to a codeword of 648−4*27*2=432 the BER increases from an order of less than $10^{-8}$ to $10^{-6}$. Depending on the application this may be an acceptable bit error rate.

An illustrative use of an error correction code transcoder according to the instant invention is a link bridge that could transcode one codeword to another for transmission over different channels without having to perform the additional processing overhead. Another application is to use an error correction code transcoder to enable network congestion control with streaming media. Another application is to enable higher reliability data communication across low power multi-hop sensor networks. The architecture of an embodiment of the invention achieves lower complexity than a traditional encoder and achieves lower power consumption. For example, bit-error rates of $10^{-6}$ are achievable, when shrinking the codeword to two-thirds of the original codeword length.

Because numerous modifications and variations of the above-described invention will occur to those of ordinary skill in the art, it is not desired to limit the invention to the exact construction and operation illustrated and described. Accordingly, all suitable modifications and equivalents may be resorted to, falling within the scope of the invention.

What is claimed is:

1. A variable data rate error protection transcoder comprising:
   an input mapper receiving an input transcodeable codeword and outputting an input intermediate codeword, wherein the input codeword comprises at least one input information bit and at least one input parity bit;
   an intermediate codeword transcoder receiving the input intermediate codeword and outputting an output intermediate codeword; and
   an output mapper receiving the output intermediate codeword and outputting an output transcoded codeword, wherein the output transcoded codeword comprises at least one output information bit and at least one output parity bit.

2. The variable data rate error protection transcoder according to claim 1, wherein said input mapper one of reduces, expands, adapts, and passes-through the input transcodeable codeword to generate the input intermediate codeword.

3. The variable data rate error protection transcoder according to claim 1, wherein said output mapper one of reduces, expands, adapts, and passes-through the output intermediate codeword to generate the output transcoded codeword.

4. The variable data rate error protection transcoder according to claim 1, further comprising:
   a transcode matrix supplier inputting a transcode matrix to said intermediate codeword transcoder.

5. The variable data rate error protection transcoder according to claim 4, wherein said intermediate codeword transcoder matrix-multiplies the transcode matrix and the input intermediate codeword to generate the output intermediate codeword.

6. The variable data rate error protection transcoder according to claim 5, wherein said intermediate codeword transcoder comprises XOR logic.

7. The variable data rate error protection transcoder according to claim 5, wherein said intermediate codeword transcoder comprises a plurality of functional units.

8. The variable data rate error protection transcoder according to claim 7, wherein said plurality of functional units comprises one of a plurality of adders and a plurality of modulo operators.

9. The variable data rate error protection transcoder according to claim 8, wherein said plurality of modulo operators comprises a plurality of Montgomery multipliers.

10. The variable data rate error protection transcoder according to claim 5, wherein said intermediate codeword transcoder comprises one of parallel circuitry, sequential circuitry, and digit-serial circuitry.

11. The variable data rate error protection transcoder according to claim 1, wherein said input mapper one of reduces, expands, adapts, and passes-through the input transcodeable codeword to generate the input intermediate codeword.

12. The variable data rate error protection transcoder according to claim 1, wherein said output mapper one of reduces, expands, adapts, and passes-through the output intermediate codeword to generate the output transcoded codeword.

13. A method of variable data rate error protection transcoding comprising:
mapping an input transcodeable codeword to an input intermediate codeword, wherein the input codeword comprises at least one input information bit and at least one input parity bit;
transcoding the input intermediate codeword into an output intermediate codeword;
mapping the output intermediate codeword to an output transcoded codeword, wherein the output transcoded codeword comprises at least one output information bit and at least one output parity bit.

14. The method according to claim 13, wherein said mapping an input transcodeable codeword to an input intermediate codeword comprises one of reducing, expanding, adapting, and passing-through the input transcodeable codeword to generate the input intermediate codeword.

15. The method according to claim 14, wherein said reducing the input transcodeable codeword to generate the input intermediate codeword comprises at least one of puncturing the input transcodeable codeword and shortening the input transcodeable codeword.

16. The method according to claim 14, wherein said expanding the input transcodeable codeword to generate the input intermediate codeword comprises at least one of extending the input transcodeable codeword, direct summing the input transcodeable codeword, and punctured direct summing the input transcodeable codeword.

17. The method according to claim 14, wherein said adapting the input transcodeable codeword to generate the input intermediate codeword comprises at least one of permutating the at least one parity bit of the input transcodeable codeword, permutating the at least one information bit of the input transcodeable codeword, and permutating the at least one parity bit and the at least one information bit of the input transcodeable codeword.

18. The method according to claim 13, wherein said mapping the output intermediate codeword to an output transcoded codeword comprises one of reducing, expanding, adapting, and passing-through the output intermediate codeword to generate the output transcoded codeword.

19. The method according to claim 18, wherein said reducing the output intermediate codeword to generate the output transcoded codeword comprises at least one of puncturing the output intermediate codeword and shortening the output intermediate codeword.

20. The method according to claim 18, wherein said expanding the output intermediate codeword to generate the output transcoded codeword comprises at least one of extending the output intermediate codeword, direct summing the output intermediate codeword, and punctured direct summing the output intermediate codeword.

21. The method according to claim 18, wherein said adapting the output intermediate codeword to generate the output transcoded codeword comprises at least one of permutating the at least one parity bit of the output intermediate codeword, permutating the at least one information bit of the output intermediate codeword, and permutating the at least one parity bit and the at least one information bit of the output intermediate codeword.

22. The method according to claim 13, wherein said transcoding the input intermediate codeword into an output intermediate codeword comprises matrix-multiplying a transcode matrix and the input intermediate codeword to generate the output intermediate codeword.

23. A variable data rate error protection transcoder comprising:
an input mapper receiving an input transcodeable codeword and outputting an input intermediate codeword, wherein the input codeword comprises at least one input information bit and at least one input parity bit;
an intermediate codeword transcoder receiving the input intermediate codeword and outputting an output intermediate codeword;
an output mapper receiving the output intermediate codeword and outputting an output transcoded codeword, wherein the output transcoded codeword comprises at least one output information bit and at least one output parity bit; and
a transcode matrix supplier inputting a transcode matrix to said intermediate codeword transcoder.

24. The variable data rate error protection transcoder according to claim 23, wherein said intermediate codeword transcoder matrix-multiplies the transcode matrix and the input intermediate codeword to generate the output intermediate codeword.

25. The variable data rate error protection transcoder according to claim 24, wherein said intermediate codeword transcoder comprises XOR logic.

26. The variable data rate error protection transcoder according to claim 24, wherein said intermediate codeword transcoder comprises a plurality of functional units.

27. The variable data rate error protection transcoder according to claim 26, wherein said plurality of functional units comprises one of a plurality of adders and a plurality of modulo operators.

28. The variable data rate error protection transcoder according to claim 27, wherein said plurality of modulo operators comprises a plurality of Montgomery multipliers.

29. The variable data rate error protection transcoder according to claim 24, wherein said intermediate codeword transcoder comprises one of parallel circuitry, sequential circuitry, and digit-serial circuitry.

* * * * *